United States Patent
Saito et al.

(10) Patent No.: US 7,538,366 B2
(45) Date of Patent: May 26, 2009

(54) NITRIDE SEMICONDUCTOR DEVICE

(75) Inventors: Wataru Saito, Kanagawa-ken (JP); Akira Yoshioka, Kanagawa-ken (JP); Hidetoshi Fujimoto, Kanagawa-ken (JP); Yasunobu Saito, Tokyo (JP); Takao Noda, Kanagawa-ken (JP); Tomohiro Nitta, Kanagawa-ken (JP); Yorito Kakiuchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 11/739,874

(22) Filed: Apr. 25, 2007

(65) Prior Publication Data
US 2007/0254431 A1    Nov. 1, 2007

(30) Foreign Application Priority Data
Apr. 26, 2006    (JP) .............................. 2006-122640

(51) Int. Cl.
*H01L 27/088* (2006.01)
(52) U.S. Cl. ................. 257/194; 257/242; 257/215; 257/401; 257/E33.028
(58) Field of Classification Search ................. None
See application file for complete search history.

(56) References Cited

U.S. PATENT DOCUMENTS

| | | | |
|---|---|---|---|
| 5,523,589 A * | 6/1996 | Edmond et al. ............... 257/77 |
| 6,555,851 B2 | 4/2003 | Morizuka | |
| 6,689,652 B2 | 2/2004 | Morizuka | |
| 6,777,278 B2 | 8/2004 | Smith | |
| 6,908,799 B2 | 6/2005 | Morizuka | |
| 7,157,748 B2 | 1/2007 | Saito et al. | |
| 2002/0096692 A1 * | 7/2002 | Nakamura et al. .......... 257/194 |
| 2005/0274977 A1 * | 12/2005 | Saito et al. ................. 257/192 |
| 2006/0011915 A1 | 1/2006 | Saito et al. | |
| 2006/0017064 A1 * | 1/2006 | Saxler et al. ................ 257/194 |
| 2006/0043501 A1 | 3/2006 | Saito et al. | |

(Continued)

FOREIGN PATENT DOCUMENTS

JP    2001-168111    6/2001

(Continued)

OTHER PUBLICATIONS

U.S. Appl. No. 11/739,874, filed Apr. 25, 2007, Saito, et al.

(Continued)

*Primary Examiner*—Evan Pert
*Assistant Examiner*—Scott R Wilson
(74) *Attorney, Agent, or Firm*—Oblon, Spivak, McClelland, Maier & Neustadt, P.C.

(57) ABSTRACT

A nitride semiconductor device includes: a conductive substrate; a first semiconductor layer provided on the substrate; a second semiconductor layer provided on the first semiconductor layer; a third semiconductor layer on the second semiconductor layer; a first main electrode connected to the third semiconductor layer; a second main electrode connected to the third semiconductor layer; and a control electrode provided on the third semiconductor layer. The first semiconductor layer is made of $Al_xGa_{1-x}N$ ($0 \leq X \leq 1$) of a first conductivity type. The second semiconductor layer is made of a first nitride semiconductor. The third semiconductor layer is made of a second nitride semiconductor which is undoped or of n-type and has a wider bandgap than the first nitride semiconductor.

19 Claims, 13 Drawing Sheets

U.S. PATENT DOCUMENTS

2006/0170003 A1    8/2006   Saito et al.
2007/0051977 A1    3/2007   Saito et al.

FOREIGN PATENT DOCUMENTS

JP     2002-57158     2/2002
JP     2004-47764     2/2004

OTHER PUBLICATIONS

U.S. Appl. No. 11/738,116, filed Apr. 20, 2007, Saito.
U.S. Appl. No. 11/507,598, filed Aug. 22, 2006, Saito, et al.

* cited by examiner

NITRIDE SEMICONDUCTOR DEVICE

CROSS-REFERENCE TO RELATED APPLICATIONS

This application is based upon and claims the benefit of priority from the prior Japanese Patent Application No. 2006-122640, filed on Apr. 26, 2006; the entire contents of which are incorporated herein by reference.

BACKGROUND OF THE INVENTION

1. Field of the Invention

This invention relates to a nitride semiconductor device, and more particularly to a nitride semiconductor device having a heterojunction field-effect transistor structure.

2. Background Art

Power semiconductor devices capable of high power control such as heterojunction field-effect transistors (HFETs) are expected to be used for switching power supply circuits and power control circuits. High breakdown voltage and low ON resistance are required of power semiconductor devices. Breakdown voltage and ON resistance depend on the device material and are in a tradeoff relationship. With the progress of technology development, power semiconductor devices have achieved low ON resistance close to the limit of silicon (Si), which is a major device material. Further reduction of ON resistance requires a new device material. For example, nitride semiconductors such as gallium nitride (GaN) and aluminum gallium nitride (AlGaN) and wide bandgap semiconductors such as silicon carbide (SiC) can be used for the material of switching devices to improve the tradeoff that depends on the device material, enabling ON resistance to be dramatically reduced.

An HFET device is formed by crystal growth of AlGaN or GaN on a support substrate made of SiC, silicon (Si), or GaN. The chip cost can be reduced because the $n^+$-SiC substrate and Si substrate are generally less expensive than the GaN substrate.

However, in a lateral HFET formed on such a conductive support substrate, a voltage is applied also between the support substrate and the drain electrode. That is, a voltage is applied also vertically. In heteroepitaxy, where the support substrate is different in material from the crystal growth layer formed thereon, crystal defects are likely to occur in the vicinity of this interface. Hence, a voltage applied to a portion having crystal defects causes a problem of decreased breakdown voltage due to the occurrence of leak current and the decrease of breakdown electric field strength.

On the other hand, JP 2004-047764A discloses a manufacturing method, where an Si-doped GaN buffer layer with a high Si concentration of $4 \times 10^{19}$ cm$^{-3}$ or more is epitaxially grown on a single crystal insulative substrate, and a nitride semiconductor layer having a single crystal structure is formed on the Si-doped GaN buffer layer by epitaxial growth.

SUMMARY OF THE INVENTION

According to an aspect of the invention, there is provided a semiconductor device including: a nitride semiconductor device comprising: a conductive substrate; a first semiconductor layer made of $Al_XGa_{1-X}N$ ($0 \leq X \leq 1$) of a first conductivity type provided on the substrate; a second semiconductor layer made of a first nitride semiconductor provided on the first semiconductor layer; a third semiconductor layer made of a second nitride semiconductor provided on the second semiconductor layer, the second nitride semiconductor being undoped or of n-type and having a wider bandgap than the first nitride semiconductor; a first main electrode connected to the third semiconductor layer; a second main electrode connected to the third semiconductor layer; and a control electrode provided on the third semiconductor layer.

According to another aspect of the invention, there is provided a nitride semiconductor device including: a conductive substrate; a first buffer layer made of an undoped AlXGa1−XN ($0 \leq X \leq 1$) provided on the substrate; a second buffer layer made of an n-type AlYGa1−YN ($0 \leq Y \leq 1$) provided on the first buffer layer; a first semiconductor layer made of a first nitride semiconductor provided on the second buffer layer; a second semiconductor layer made of a second nitride semiconductor provided on the first semiconductor layer, the second nitride semiconductor being undoped or of n-type and having a wider bandgap than the first nitride semiconductor; a first main electrode connected to the second semiconductor layer and the substrate; a second main electrode connected to the second semiconductor layer; and a control electrode provided on the second semiconductor layer.

According to an aspect of the invention, there is provided a nitride semiconductor device including: a conductive substrate having a laminated structure in which a lowly doped Si layer is formed on a highly doped p-type Si substrate; a buffer layer made of $Al_XGa_{1-X}N$ ($0 \leq X \leq 1$) of a first conductivity type provided on the conductive substrate; a first semiconductor layer made of a first nitride semiconductor provided on the buffer layer; a second semiconductor layer made of a second nitride semiconductor provided on the first semiconductor layer, the second nitride semiconductor being undoped or of n-type and having a wider bandgap than the first nitride semiconductor; a first main electrode connected to the second semiconductor layer and the conductive substrate; a second main electrode connected to the second semiconductor layer; a control electrode provided on the second semiconductor layer; and an insulator covering a side face of the buffer layer.

DETAILED DESCRIPTION OF THE INVENTION

An embodiment of the invention will now be described with reference to the drawings.

Figure 1A:
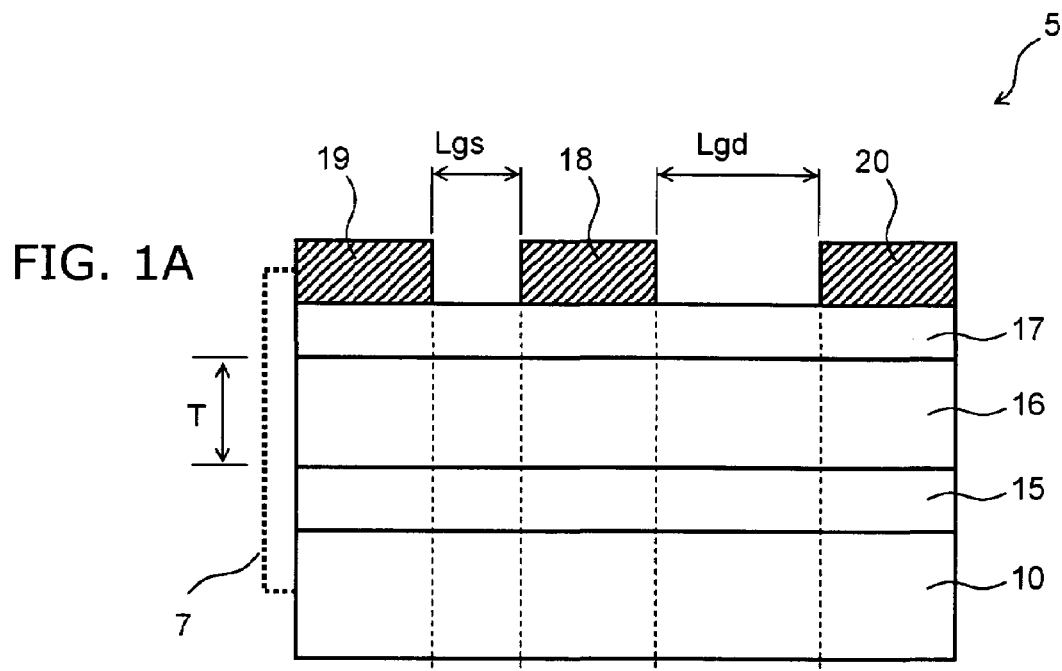
FIG. 1A is a schematic cross-sectional view showing a first example of a nitride semiconductor device according to this embodiment.
Figure 1B:
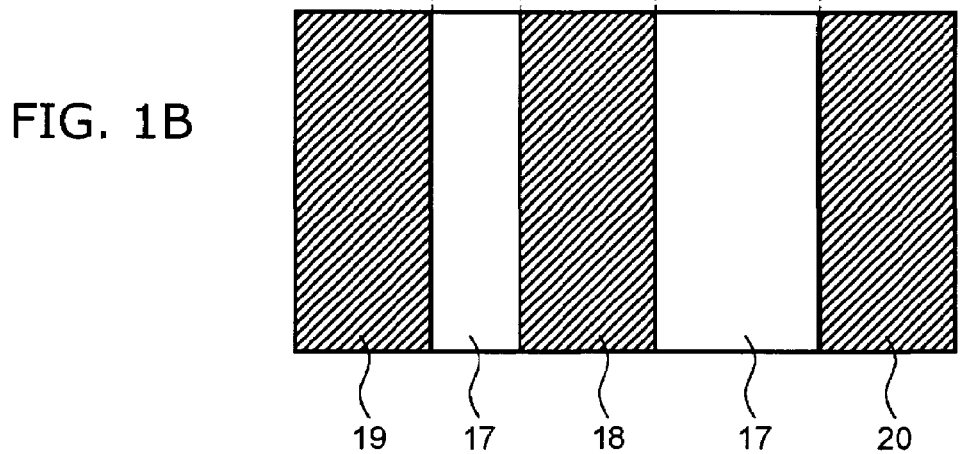
FIG. 1B is a schematic plan view thereof.

FIG. 1A is a schematic cross-sectional view showing a first example of a nitride semiconductor device according to this embodiment, and FIG. 1B is a schematic plan view thereof. In the figures subsequent to FIG. 1, components similar to those described previously are marked with the same reference numerals and the detailed description thereof is omitted as appropriate.

The nitride semiconductor device 5 of this embodiment includes an $n^+$-type aluminum nitride (AlN) buffer layer 15 on a conductive support substrate, e.g. a highly doped n-type ($n^+$-type) SiC substrate 10.

A gallium nitride (GaN) layer 16 is provided on the $n^+$-type AlN buffer layer 15. An aluminum gallium nitride (AlGaN) layer 17 having a wider bandgap than the GaN layer 16 is provided on the GaN layer 16. A two-dimensional electron gas (2DEG) is formed in the GaN layer 16 neighboring the AlGaN layer 17. On the AlGaN layer 17, a source electrode 19 and a drain electrode 20 forming ohmic contact are provided. A gate electrode 18 forming Schottky contact is provided between the electrodes 19 and 20.

Here, the minimum distance Lgd between the gate electrode 18 and the drain electrode 20 is longer than the minimum distance Lgs between the gate electrode 18 and the source electrode 19 (Lgd>Lgs). Such an asymmetric structure with respect to the gate electrode 18 can alleviate electric field concentration occurring at the edge of the gate electrode 18 on the drain electrode 20 side. This makes it possible to increase breakdown voltage and to prevent current collapse. As the minimum distance Lgd increases, the electric field concentration occurring at the edge of the gate electrode 18 can be significantly reduced. Hence, it is preferably longer than the minimum distance Lgs between the gate electrode 18 and the source electrode 19.

The $n^+$-type SiC substrate 10 is connected to the source electrode 19 through an interconnect 7. Thus the $n^+$-type SiC substrate 10 serves as a backside field plate electrode. This can alleviate electric field concentration occurring at the edge of the gate electrode 18 on the drain electrode 20 side. As a result, a high breakdown voltage is achieved, and the current collapse is prevented. The term "current collapse" refers to a phenomenon where, when the electric field concentrates on the gate edge, electrons are accelerated and trapped by defects and interfacial levels, thereby increasing the ON resistance.

The interconnect 7 can be formed by, for example, soldering the $n^+$-type SiC substrate 10 to a package base such as a copper plate and connecting the base to the source electrode 19 by wire bonding. Alternatively, a trench groove may be etched from the device surface and filled with metal to form a via electrode, thereby connecting the substrate 10 to the source electrode 19.

In general, the composition of the $n^+$-type AlN buffer layer 15 can be expressed as $Al_xGa_{1-x}N$ ($0 \leq X \leq 1$), for example. The GaN layer 16 may contain Al and can be made of undoped $Al_yGa_{1-y}N$ ($0 \leq Y \leq 1$, X>Y), for example. The AlGaN layer 17 is made of material having a wider bandgap than the GaN layer 16, and can be made of undoped or n-type $Al_zGa_{1-z}N$ ($0 \leq Z \leq 1$, Y<Z), for example.

The thickness of the layers can be illustratively configured as follows: 250 micrometers for the $n^+$-type SiC substrate 10, about 100 nanometers for the $n^+$-type AlN buffer layer 15, 3 micrometers for the GaN layer 16, and 30 nanometers for the AlGaN layer 17. The concentration in the $n^+$-type SiC substrate 10 can be set to about $2 \times 10^{18}$ cm$^{-3}$.

Next, the operation of this example is described.

Figure 2:
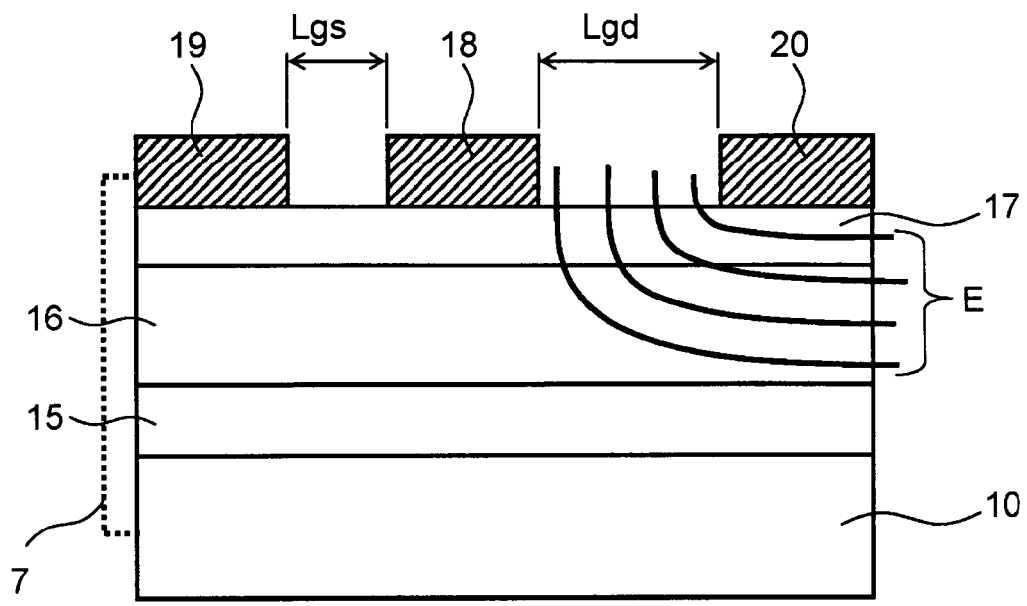
FIG. 2 is a schematic cross-sectional view illustrating the operation of the nitride semiconductor device of the first example.

FIG. 2 is a schematic cross-sectional view illustrating the operation of the nitride semiconductor device of the first example.

Figure 3:
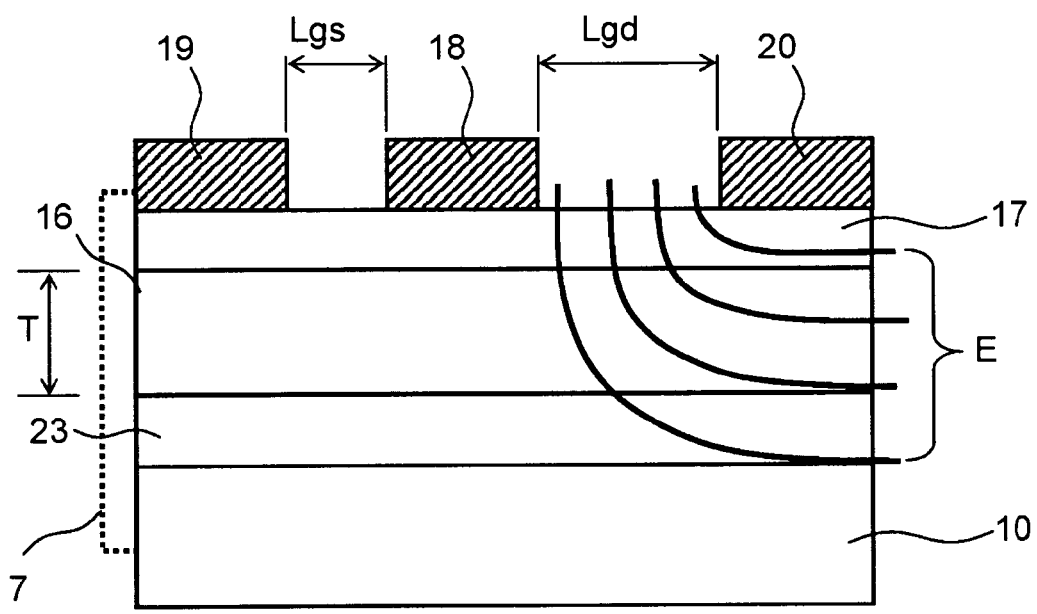
FIG. 3 is a schematic cross-sectional view illustrating the operation of a first comparative example investigated by the inventor in the course of reaching the invention.

FIG. 3 is a schematic cross-sectional view illustrating the operation of a comparative example investigated by the inventor in the course of reaching the invention.

Here, the electric field generated from the drain electrode 20 is shown by equipotential lines E.

The comparative example is first described.

As shown in FIG. 3, the basic structure of this comparative example is similar to that of the first example shown in FIG. 1. However, the structure of this comparative example includes an insulative AlN buffer layer 23 instead of the $n^+$-type AlN buffer layer 15. The AlN buffer layer 23 formed on the $n^+$-type SiC substrate 10 is a heteroepitaxial growth layer. Hence crystal defects are likely to occur in the vicinity of the interface between the $n^+$-type SiC substrate 10 and the AlN buffer layer 23.

Upon application of voltage to the drain electrode 20, a voltage is applied also between the drain electrode 20 and the $n^+$-type SiC substrate 10. Thus an electric field is applied between the drain electrode 20 and the $n^+$-type SiC substrate 10 as shown by the equipotential lines E. As a result, the electric field is applied to the AlN buffer layer 23 having crystal defects in the vicinity of the $n^+$-type SiC substrate 10, causing leak current, or breakdown at a low electric field. That is, in this comparative example, even if the $n^+$-type SiC substrate 10 is connected to the source electrode 19 through the interconnect 7 to serve as a backside field plate electrode, application of electric field to the AlN buffer layer 23 having many crystal defects results in decreasing the breakdown voltage between the n$^+$-type SiC substrate 10 and the drain electrode 20. Consequently, high breakdown voltage is not achieved.

In contrast, as shown in FIG. 2, in the structure of the present example, a conductive n$^+$-type AlN buffer layer 15 is provided on the n$^+$-type SiC substrate 10. Although an electric field is applied to the GaN layer 16 and the AlGaN layer 17, the electric field rapidly decreases in the n$^+$-type AlN buffer layer 15. This prevents, according to this example, application of electric field to the vicinity of the interface between the n$^+$-type SiC substrate 10 and the n$^+$-type AlN buffer layer 15. Hence a high breakdown voltage can be achieved between the n$^+$-type SiC substrate 10 and the drain electrode 20. Furthermore, as described above, the n$^+$-type SiC substrate 10 can be connected to the source electrode 19 through the interconnect 7 to serve as a field plate electrode, thereby alleviating electric field concentration occurring at the edge of the gate electrode 18. According to this example, through the synergy of these effects, the breakdown voltage of the device can be comprehensively increased.

It is noted that application of voltage can be prevented also when the n$^+$-type AlN buffer layer 15 is replaced by a highly doped p-type (p$^+$-type) AlN buffer layer. In this case, preferably, the substrate 10 is also made of p$^+$-type SiC.

If the n$^+$-type AlN buffer layer 15 has a low concentration, it is depleted, and an electric field is applied to the n$^+$-type AlN buffer layer 15 in the vicinity of the interface with the n$^+$-type SiC substrate 10. This may result in leak current or decreased breakdown voltage. Therefore, preferably, the electron concentration in the n$^+$-type AlN buffer layer 15 is comparable to the electron concentration of the 2DEG, that is, about $1 \times 10^{13}$ cm$^{-2}$ or more in terms of sheet concentration.

The breakdown voltage of an HFET depends on the vertical electric field passing through the GaN layer 16, that is, on the GaN thickness. The breakdown electric field strength of the GaN layer 16 is about 3.3 megavolts per centimeter, for example. Hence, to obtain a breakdown voltage of e.g. 600 volts or more, the thickness T of the GaN layer 16 is preferably set to e.g. about 2 micrometers or more. In this case, the minimum distance Lgd between the gate electrode 18 and the drain electrode 20 is preferably larger than the thickness T of the GaN layer 16 (Lgd>T) so that the breakdown voltage is determined by the thickness of the GaN layer 16, which has high controllability.

Figure 4:
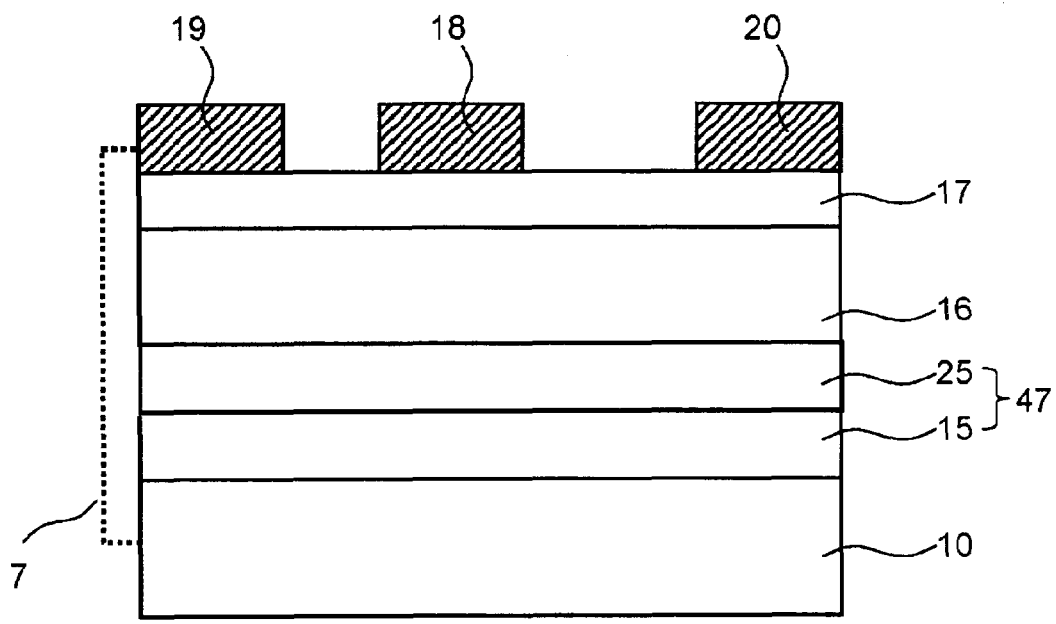
FIG. 4 is a schematic cross-sectional view showing a second example of the nitride semiconductor device according to this embodiment.

FIG. 4 is a schematic cross-sectional view showing a second example of the nitride semiconductor device according to this embodiment.

The basic structure of this example is the same as that of the first example shown in FIG. 1. However, an n-type buffer layer 47b composed of an n$^+$-type AlN buffer layer 15 and an n$^+$-type GaN buffer layer 25 is provided between the n$^+$-type SiC substrate 10 and the GaN layer 16. That is, even if crystal defects are not sufficiently decreased in the n$^+$-type AlN buffer layer 15, crystal defects in the n$^+$-type GaN buffer layer 25 can be decreased by forming the n$^+$-type GaN buffer layer 25 at an increased rate of lateral epitaxial growth. By epitaxial growth of an undoped GaN layer 16 on the n$^+$-type GaN buffer layer 25, crystal defects in the GaN layer 16 are decreased. Thus the breakdown voltage can be increased.

Figure 5:
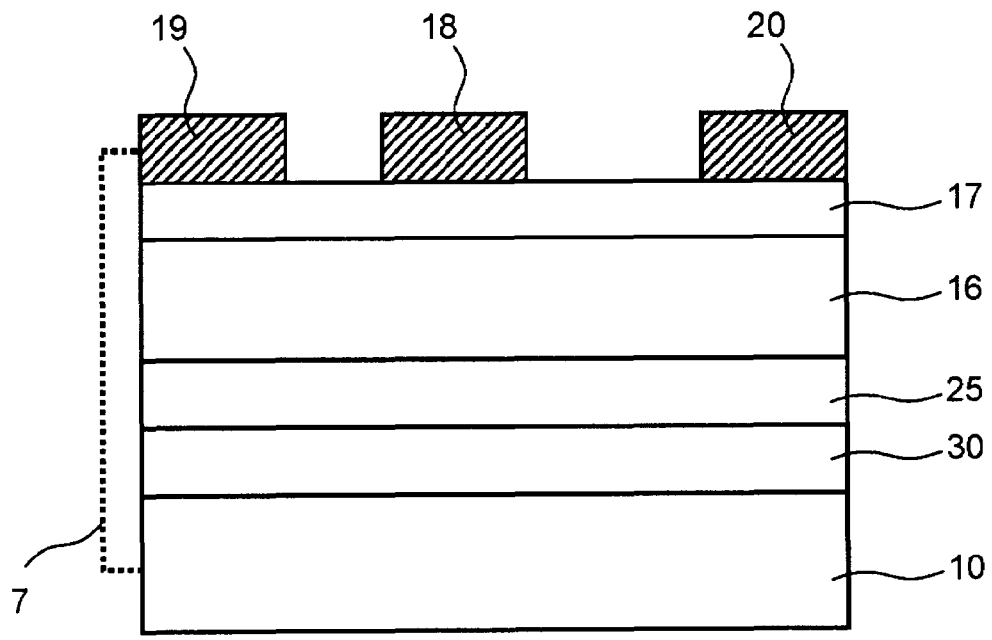
FIG. 5 is a schematic cross-sectional view showing a third example of the nitride semiconductor device according to this embodiment.

FIG. 5 is a schematic cross-sectional view showing a third example of the nitride semiconductor device according to this embodiment.

The basic structure of this example is similar to that of the second example shown in FIG. 4. However, the n$^+$-type AlN buffer layer 15 is replaced by an undoped AlN buffer layer 30.

According to this example, no substantial electric field is applied to the undoped AlN buffer layer 30 because the n$^+$-type GaN buffer layer 25 is provided on the undoped AlN buffer layer 30. Thus a high breakdown voltage is achieved.

Figure 6:
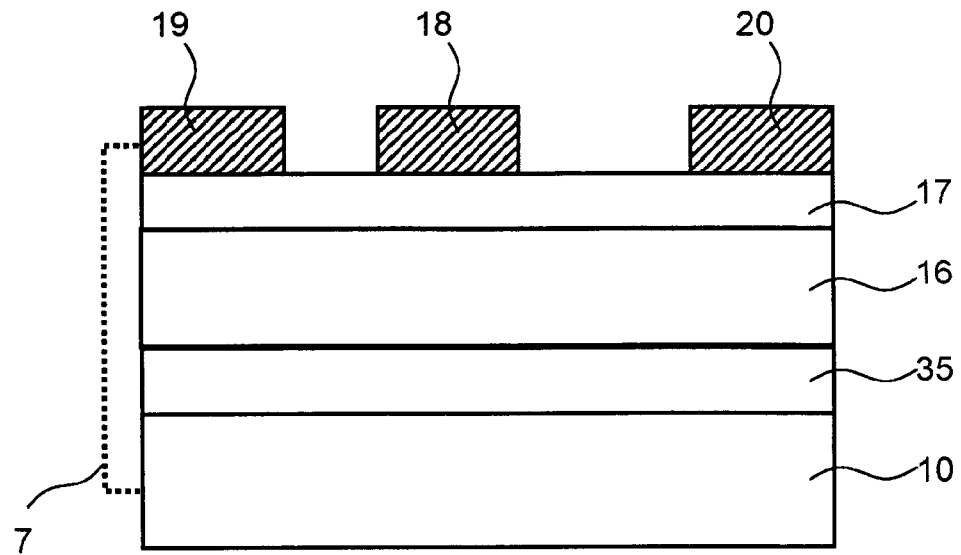
FIG. 6 is a schematic cross-sectional view showing a fourth example of the nitride semiconductor device according to this embodiment.

FIG. 6 is a schematic cross-sectional view showing a fourth example of the nitride semiconductor device according to this embodiment.

The basic structure of this example is the same as that of the first example shown in FIG. 1. However, the n$^+$-type AlN buffer layer 15 is replaced by an n$^+$-type AlGaN buffer layer 35. Also in this structure, as in the first example described above, a high breakdown voltage is achieved because no electric field is applied to the n$^+$-type AlGaN buffer layer 35. Here, the composition ratio of the n$^+$-type AlGaN buffer layer 35 does not need to be vertically constant. For example, the Al composition ratio may be higher on the n$^+$-type SiC substrate 10 side and lower on the GaN layer 16 side.

Figure 7:
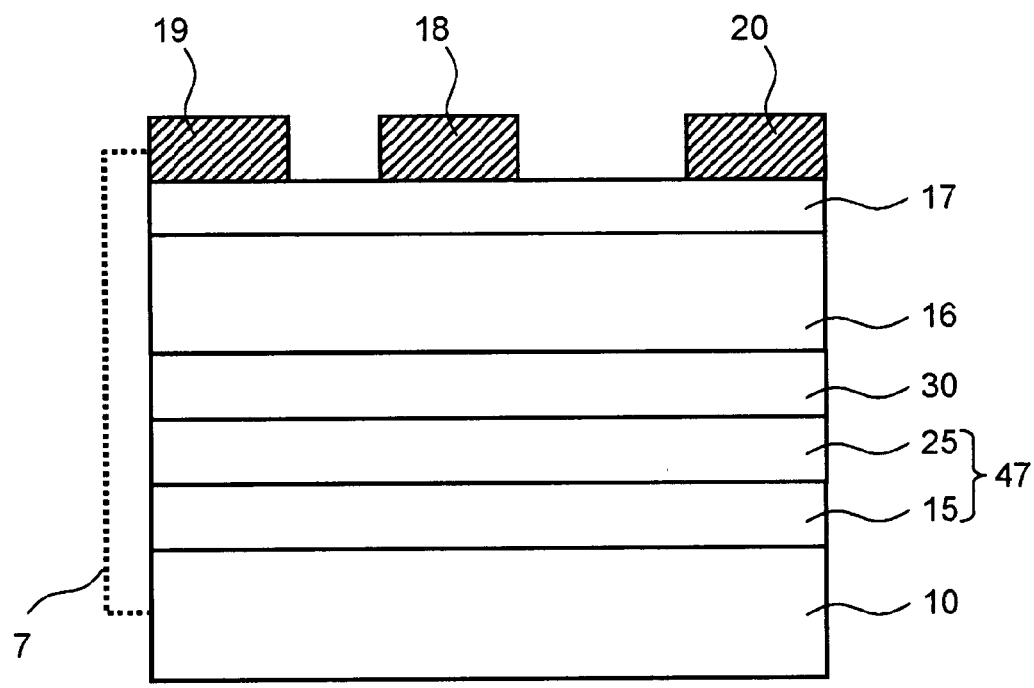
FIG. 7 is a schematic cross-sectional view showing a fifth example of the nitride semiconductor device according to this embodiment.

FIG. 7 is a schematic cross-sectional view showing a fifth example of the nitride semiconductor device according to this embodiment.

Figure 8:
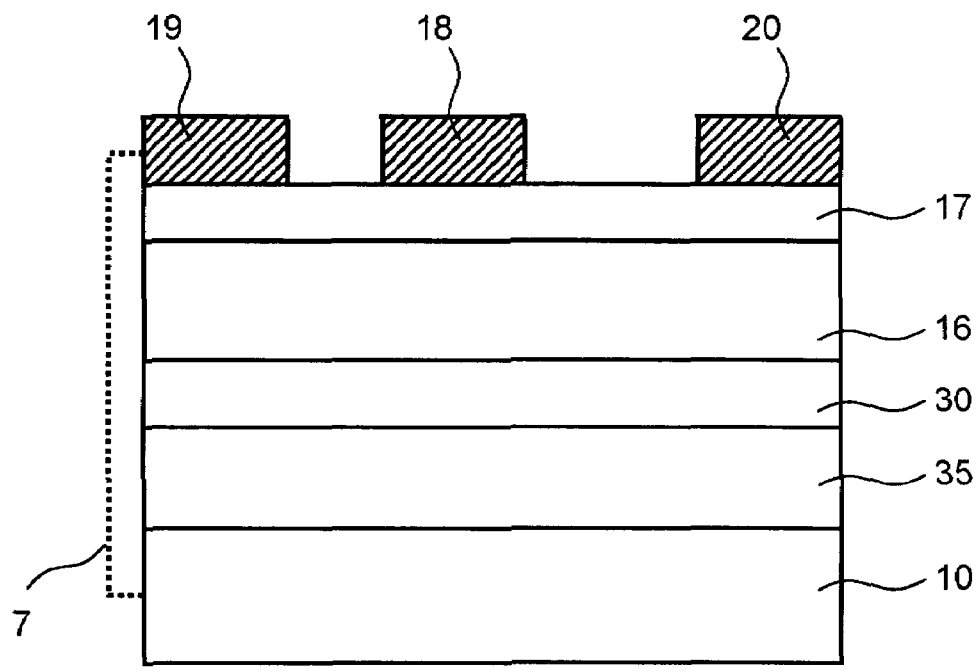
FIG. 8 is a schematic cross-sectional view showing a sixth example of the nitride semiconductor device according to this embodiment.

FIG. 8 is a schematic cross-sectional view showing a sixth example of the nitride semiconductor device according to this embodiment.

As shown in FIG. 7, the basic structure of these examples is the same as that of the first example shown in FIG. 1. However, an n-type buffer layer 47 composed of an n$^+$-type AlN buffer layer 15 and an n$^+$-type GaN buffer layer 25, and an undoped AlN buffer layer 30 are provided in this order between the n$^+$-type SiC substrate 10 and the GaN layer 16.

In the first and second example described above, a band discontinuity occurs between the n$^+$-type SiC substrate 10 and the n$^+$-type AlN buffer layer 15. However, the n$^+$-type AlN buffer layer 15 is made of highly doped n-type semiconductor and includes crystal defects. Hence electrons may tunnel therethrough. The resistance between the SiC substrate 10 and the drain electrode 20 depends on the resistance of the undoped GaN layer 16, and leak current may flow depending on this resistance.

Thus, in this example, an undoped AlN buffer layer 30 is provided between the undoped GaN layer 16 and the n$^+$-type GaN buffer layer 25 to form a band barrier for blocking electron flow. Hence electrons can be accumulated at the interface between the n$^+$-type GaN buffer layer 25 and the undoped AlN layer. Therefore leak current flowing between the source electrode 19 and the drain electrode 20 can be reduced.

Here, the undoped AlN buffer layer 30 only needs to serve to block electrons flowing in from the n$^+$-type SiC substrate 10. Hence, as shown in FIG. 8, the n$^+$-type AlN buffer layer 15 and the n$^+$-type GaN buffer layer 25 in FIG. 7 can be replaced by an n$^+$-type AlGaN buffer layer 35, for example, having a narrower bandgap than the undoped AlN buffer layer 30 to achieve the same effect. In this case, the composition ratio of the n$^+$-type AlGaN buffer layer 35 does not need to be constant. For example, the Al composition ratio may be higher on the SiC substrate side and lower on the GaN layer 16 side.

Figure 9:
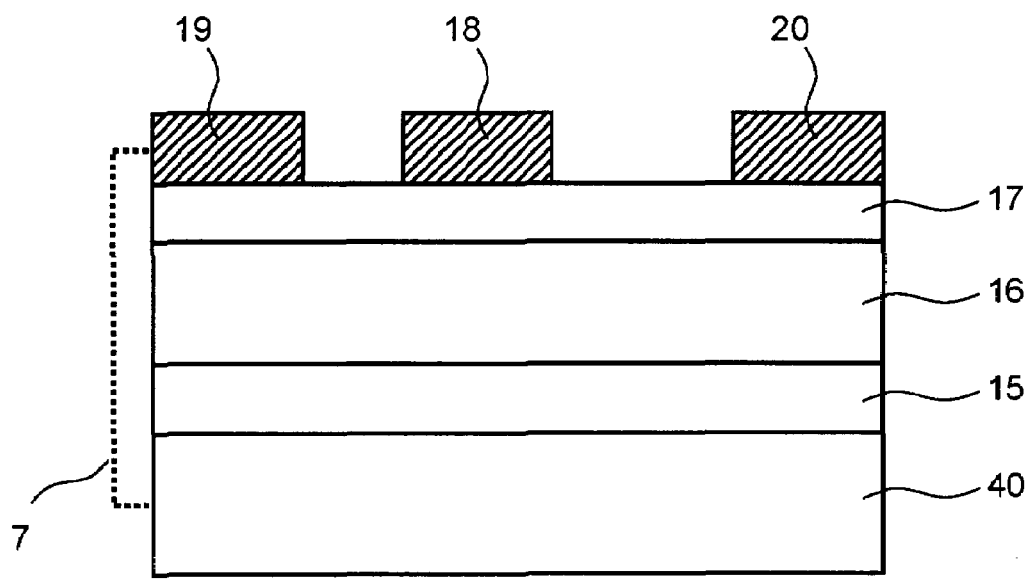
FIG. 9 is a schematic cross-sectional view showing a seventh example of the nitride semiconductor device according to this embodiment.

FIG. 9 is a schematic cross-sectional view showing a seventh example of the nitride semiconductor device according to this embodiment.

The basic structure of this example is the same as that of the first example shown in FIG. 1. However, the n$^+$-type SiC substrate 10 is replaced by an n$^+$-type Si substrate 40. According to this example, the n$^+$-type AlN buffer layer 15 is provided on the n$^+$-type Si substrate 40. Thus it is possible to prevent application of electric field to the vicinity of the interface having many crystal defects, thereby achieving a high breakdown voltage.

Figure 10:
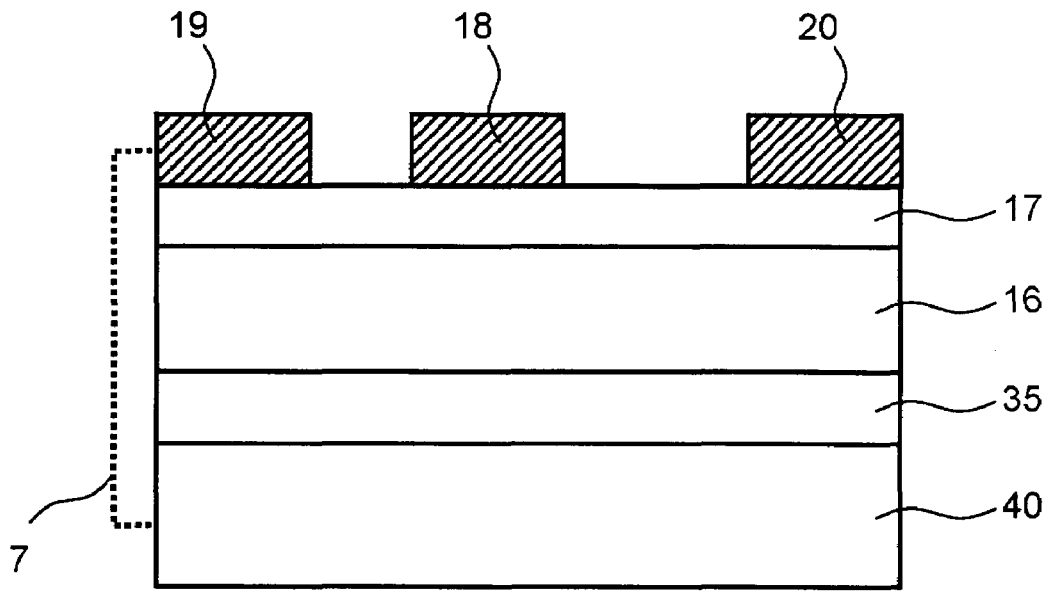
FIG. 10 is a schematic cross-sectional view showing an eighth example of the nitride semiconductor device according to this embodiment.

FIG. 10 is a schematic cross-sectional view showing an eighth example of the nitride semiconductor device according to this embodiment.

Figure 11:
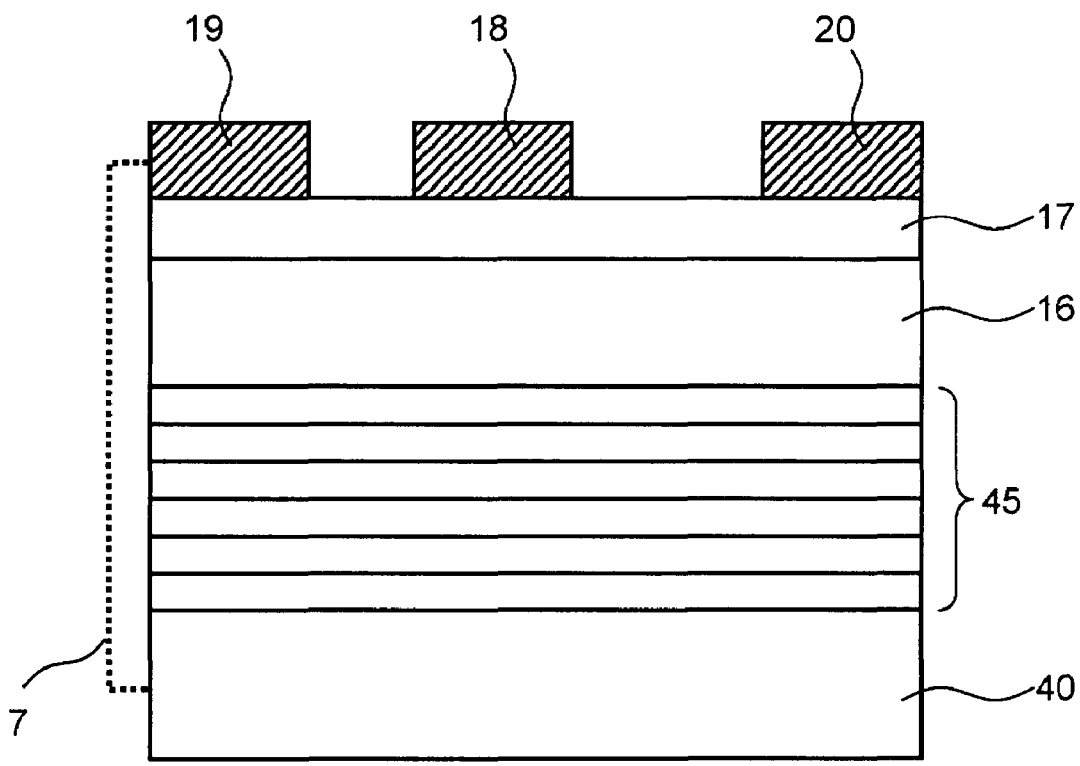
FIG. 11 is a schematic cross-sectional view showing a ninth example of the nitride semiconductor device according to this embodiment.

FIG. 11 is a schematic cross-sectional view showing a ninth example of the nitride semiconductor device according to this embodiment.

As shown in FIG. 10, the basic structure of these examples is the same as that of the seventh example shown in FIG. 9. However, the n+-type AlN buffer layer 15 is replaced by an n+-type AlGaN buffer layer 35. According to this example, by providing the n+-type AlGaN buffer layer 35 on the Si substrate 40, application of electric field to the n+-type AlGaN buffer layer 35 can be prevented, and a high breakdown voltage is achieved. The composition ratio of the n+-type AlGaN buffer layer 35 does not need to be constant. For example, the Al composition ratio may be higher on the Si substrate side and lower on the GaN layer 16 side. Here, the same effect is achieved also when the Al composition ratio is varied stepwise.

As shown in FIG. 11, a high breakdown voltage is achieved also when the n+-type AlN buffer layer 15 of the seventh example shown in FIG. 9 is replaced by an n+-type AlN/GaN laminated buffer layer 45. Here, the layer thickness and the number of layers in the n+-type AlN/GaN laminated buffer layer 45 are not limited to this example.

Furthermore, this example is not limited to the use of the n+-type AlN/GaN laminated buffer layer 45. An n+-type GaN/AlGaN laminated buffer layer can also be used to achieve the effect of this example.

As shown in FIGS. 10 and 11, the n+-type AlGaN buffer layer 35 or n+-type AlN/GaN laminated buffer layer 45 provided between the n+-type Si substrate 40 and the GaN layer 16 can control stress occurring at the interface, thereby reducing substrate warpage and cracks in the growth layer, which are prone to occur after epitaxial growth.

Figure 12:
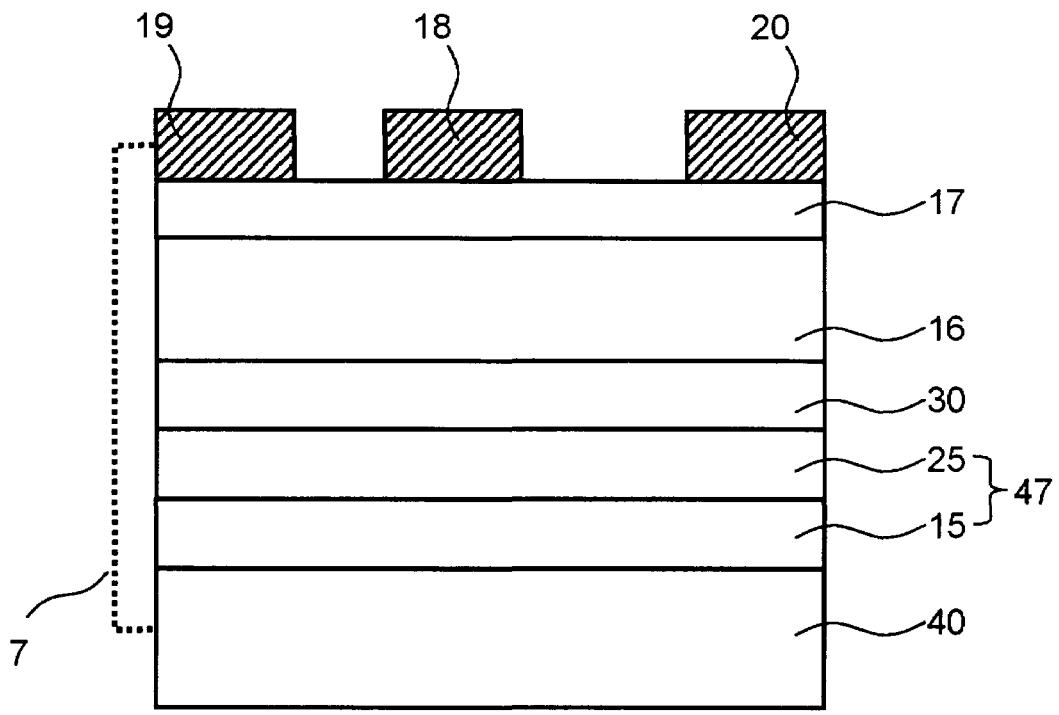
FIG. 12 is a schematic cross-sectional view showing a tenth example of the nitride semiconductor device according to this embodiment.

FIG. 12 is a schematic cross-sectional view showing a tenth example of the nitride semiconductor device according to this embodiment.

The basic structure of this example is the same as that of the seventh example shown in FIG. 9. However, an n-type buffer layer 47 composed of an n+-type AlN buffer layer 15 and an n+-type GaN buffer layer 25, and an undoped AlN buffer layer 30 are provided in this order between the n+-type Si substrate 40 and the GaN layer 16. Hence electrons are accumulated at the interface between the n+-type GaN buffer layer 25 and the undoped AlN layer. Therefore leak current flowing between the source electrode 19 and the drain electrode 20 can be reduced.

Here, the undoped AlN buffer layer 30 only needs to serve to block electrons flowing in from the n+-type Si substrate 40. Hence, the n-type buffer layer 47 can be replaced by an n+-type AlGaN buffer layer 35, for example, to achieve the same effect. In this case, the composition ratio of the n+-type AlGaN buffer layer 35 does not need to be constant. For example, the Al composition ratio may be higher on the Si substrate side and lower on the GaN layer 16 side.

Figure 13:
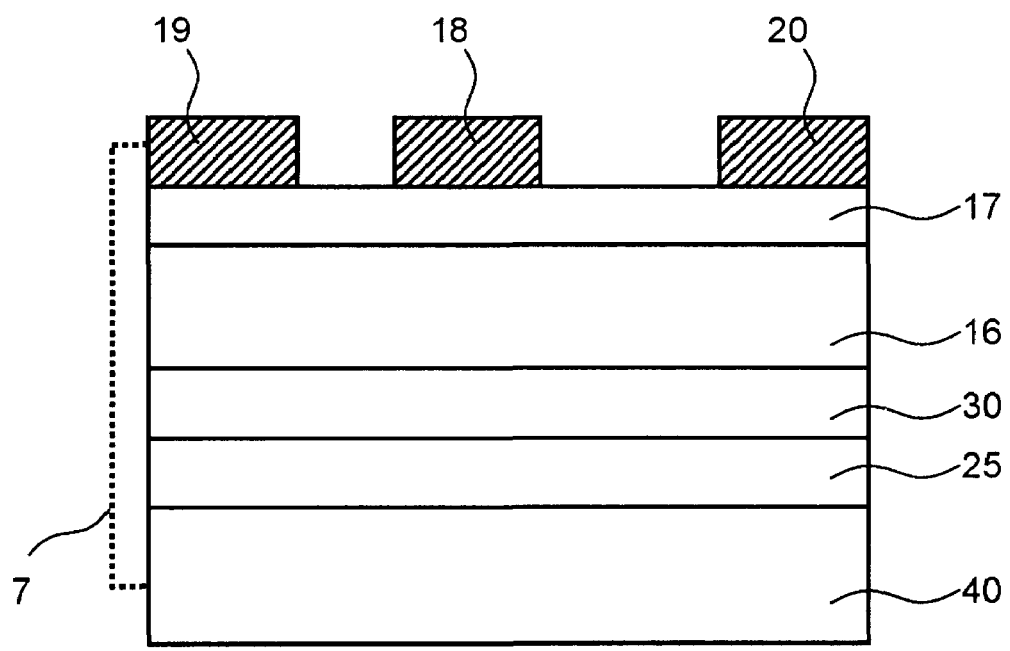
FIG. 13 is a schematic cross-sectional view showing an eleventh example of the nitride semiconductor device according to this embodiment.

FIG. 13 is a schematic cross-sectional view showing an eleventh example of the nitride semiconductor device according to this embodiment.

The basic structure of this example is the same as that of the tenth example shown in FIG. 12. However, an n+-type GaN buffer layer 25 and an undoped AlN buffer layer 30 are provided in this order between the n+-type Si substrate 40 and the GaN layer 16. Conventionally, when an GaN layer 16 is epitaxially grown on the n+-type Si substrate 40, an AlN buffer layer 23 is provided between the n+-type Si substrate 40 and the GaN layer 16 in order to prevent Si elements in the n+-type Si substrate 40 from being captured as n-type dopants.

In contrast, according to this example, the vicinity of the interface with the n+-type Si substrate 40 is doped with n-type dopants. Hence, without the AlN buffer layer 23, a GaN layer 16 can be formed directly on the n+-type Si substrate 40. Furthermore, by providing the undoped AlN buffer layer 30 on the n+-type GaN buffer layer 25, electrons can be accumulated at the interface between the n+-type GaN buffer layer 25 and the undoped AlN buffer layer 30, thereby reducing leak current.

Figure 14:
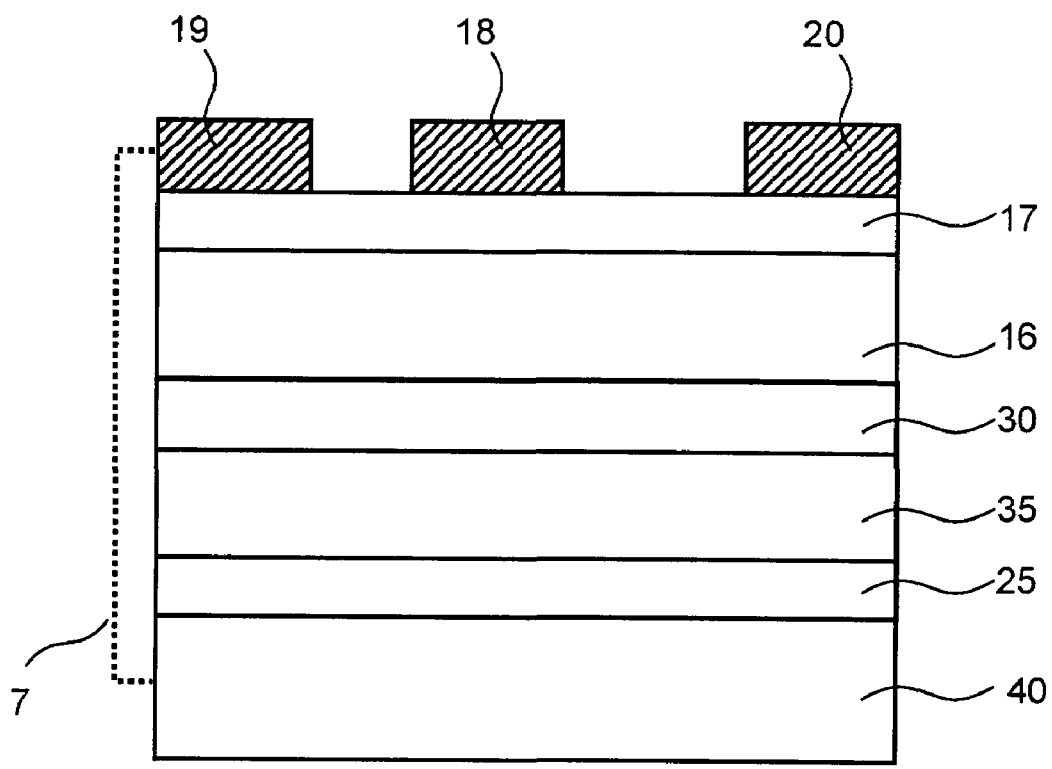
FIG. 14 is a schematic cross-sectional view showing a twelfth example of the nitride semiconductor device according to this embodiment.
Figure 15:
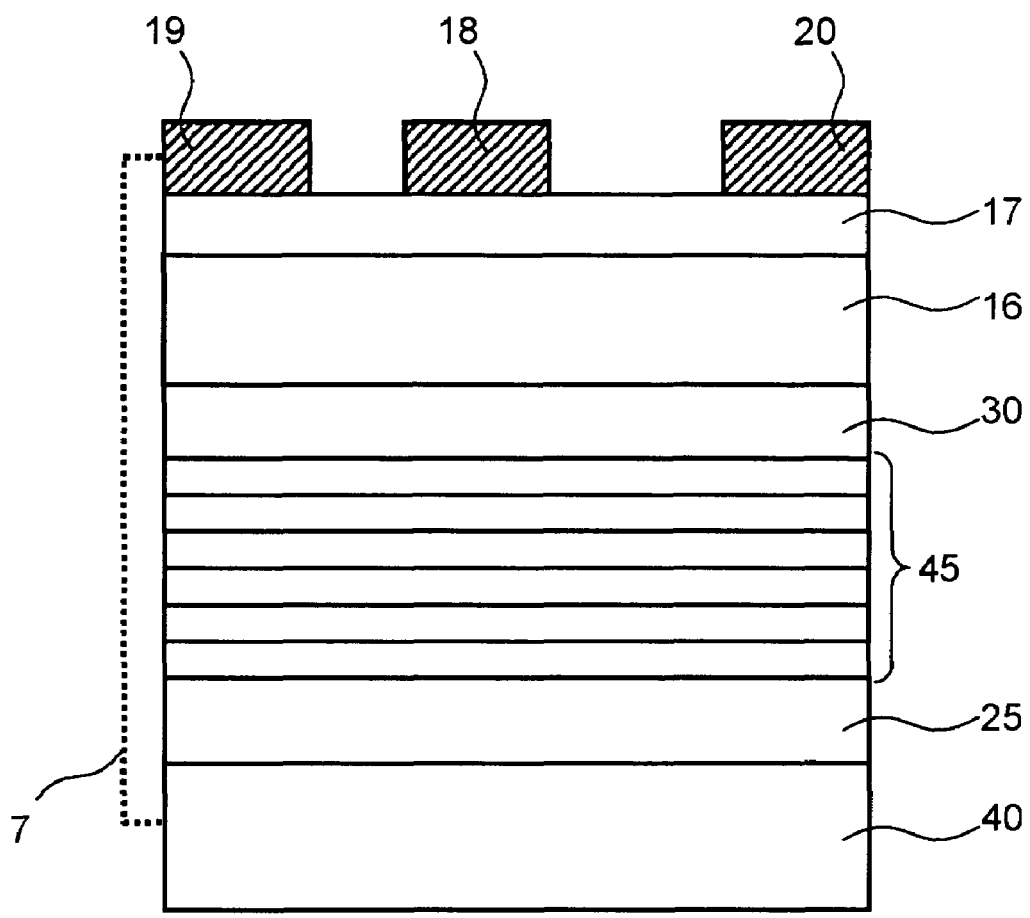
FIG. 15 is a schematic cross-sectional view showing a thirteenth example of the nitride semiconductor device according to this embodiment.

FIG. 14 is a schematic cross-sectional view showing a twelfth example of the nitride semiconductor device according to this embodiment. FIG. 15 is a schematic cross-sectional view showing a thirteenth example of the nitride semiconductor device according to this embodiment. As shown in FIG. 14, the basic structure of these examples is the same as that of the eleventh example shown in FIG. 13.

However, an n+-type AlGaN buffer layer 35 is inserted between the undoped AlN buffer layer 30 and the n+-type GaN buffer layer 25. Thus, by inserting the n+-type AlGaN buffer layer 35, the lattice strain of the undoped AlN buffer layer 30 provided on the n+-type GaN buffer layer 25 can be alleviated to achieve the same effect as that of the eleventh example described above with reference to FIG. 13.

The Al composition ratio of the AlGaN buffer layer does not need to be constant. However, if the Al composition ratio of the n+-type AlGaN buffer layer 35 in the vicinity of the undoped AlN buffer layer 30 is made smaller than 100%, vertical electron flow from the Si substrate to the drain electrode 20 can be reduced by the band discontinuity formed between the AlGaN buffer layer and the undoped AlN buffer layer 30.

Furthermore, as shown in FIG. 15, an n+-type AlN/GaN laminated buffer layer 45 can be inserted instead of the n+-type AlGaN buffer layer 35 in FIG. 14 to achieve the same effect as that of the twelfth example described above with reference to FIG. 14. Here, the layer thickness and the number of layers in the n+-type AlN/GaN laminated buffer layer 45 are not limited. While this example has been described using the n+-type Si substrate 40, this example is also applicable to structures based on the n+-type SiC substrate 10. Furthermore, the n+-type Si substrate can be replaced by a p+-type Si substrate, and a p+-type AlGaN buffer layer or a p+-type AlN/GaN laminated buffer layer can be formed thereon.

Figure 16:
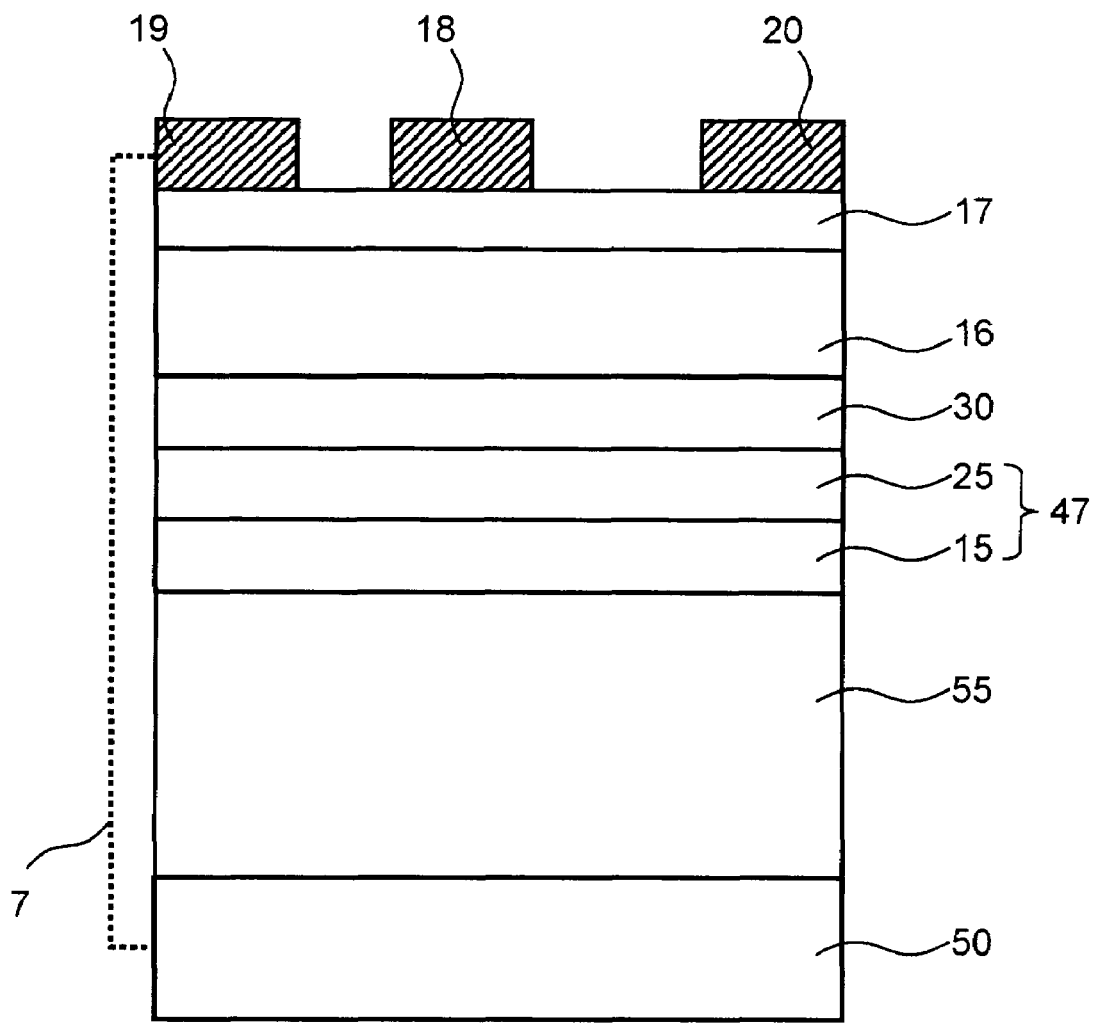
FIG. 16 is a schematic cross-sectional view showing a fourteenth example of the nitride semiconductor device according to this embodiment.

FIG. 16 is a schematic cross-sectional view showing a fourteenth example of the nitride semiconductor device according to this embodiment.

The basic structure of this example is the same as that of the first example shown in FIG. 1. However, the GaN layer 16 and the AlGaN layer 17 are provided on a highly doped p-type (p+-type) Si substrate. More specifically, an n-type lowly doped (n−-type) Si epitaxial growth layer, an n+-type AlN buffer layer 15 serving as a nitride semiconductor layer, an n+-type GaN buffer layer 25, and an undoped AlN buffer layer 30 are provided in this order between the p+-type Si substrate 50 and the GaN layer 16.

According to this example, when a high voltage is applied to the drain electrode 20, the n−-type Si epitaxial growth layer 55 can be depleted. Hence the vertical electric field in the GaN layer 16 is decreased. Therefore, even if the thickness of the GaN layer 16 is as small as about 1 micrometer, for example, a high breakdown voltage can be achieved.

Furthermore, the Si epitaxial growth layer 55 can be depleted also by being doped with p-type dopants, and the same effect is achieved. For depletion, whether n-type or p-type, the dopant concentration in the Si epitaxial growth layer 55 is preferably $1\times10^{16}$ cm$^{-3}$ or less.

In this example, an n-type buffer layer 47 composed of an n$^+$-type AlN buffer layer 15 and an n$^+$-type GaN buffer layer 25 is provided on the n$^-$-type Si epitaxial growth layer 55. However, the n-type buffer layer 47 can be replaced by an AlGaN layer 17 or an AlN/GaN laminated structure to achieve the same effect as that of this example.

On the other hand, according to this example, the n-type buffer layer 47 has an intermediate potential between the p$^+$-type Si substrate 50 and the drain electrode 20. Hence a voltage is applied also between the source electrode 19 and the n-type buffer layer 47. When the device is designed so that the outer periphery of the device is surrounded by the source electrode 19, the n-type buffer layer 47 is exposed to the cross section of the diced chip. When the source electrode 19 is connected to the n-type buffer layer 47 via the chip cross section, an electric field is applied also to the chip cross section. Fracture layers and the like due to dicing are formed on the chip cross section, and are likely to be responsible for leak current and decreased breakdown voltage. Hence, preferably, the side face of the n-type buffer layer 47 is covered by an insulator.

Figure 17A:
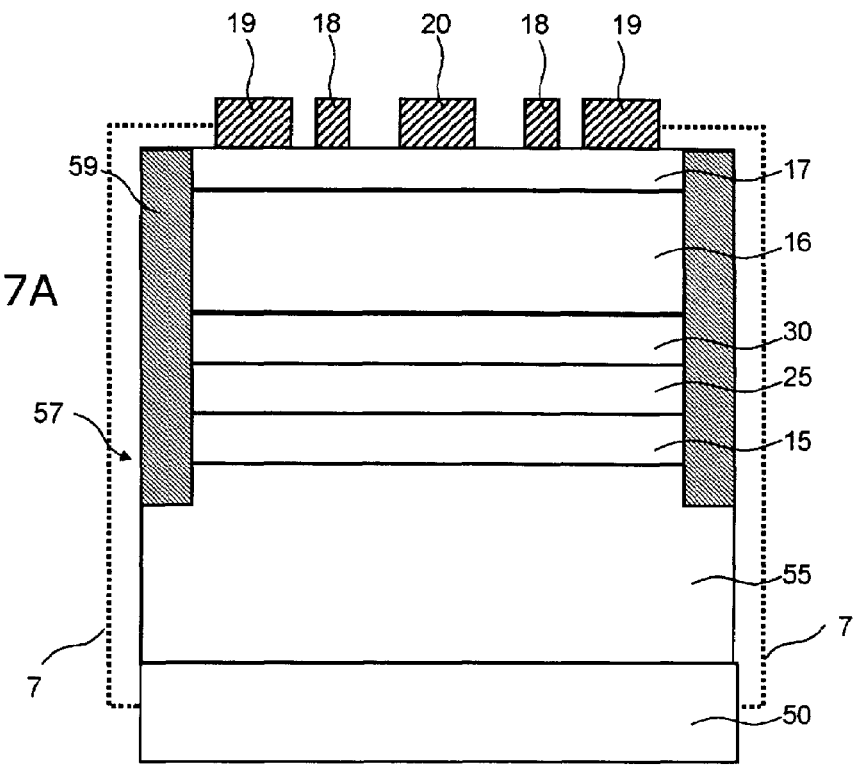
FIG. 17A is a schematic cross-sectional view showing a fifteenth example of the nitride semiconductor device according to this embodiment.
Figure 17B:
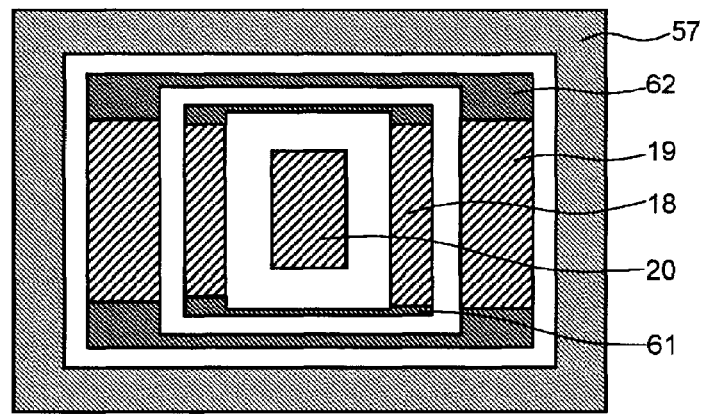
FIG. 17B is a schematic plan view thereof.

FIG. 17A is a schematic cross-sectional view showing a fifteenth example of the nitride semiconductor device according to this embodiment, and FIG. 17B is a schematic plan view thereof.

As shown in FIGS. 17A and 17B, in the structure of this example, the device region in includes the gate electrode 18, source electrode 19 and drain electrode 20, and the outer periphery of the device region is surrounded by a trench 57. The bottom face of the trench 57 reaches the n$^-$-type Si epitaxial growth layer 55. The trench 57 is filled with an insulator 59, which enables the chip cross section to be isolated from the n-type buffer layer of the device section. Thus, the side face of the n-type buffer layer 47 is covered by the insulator 59.

Here, the material of the insulator 59 filling the trench 57 is not limited. For example, silicon oxide (SiO$_x$) and silicon nitride (SiN) can also be used.

As shown in FIG. 17B, the HEMT of this example comprises a drain electrode 20 shaped like a stripe, gate electrodes 18, and source electrodes 19. Two gate electrodes 18 are provided parallel to the longitudinal axis of the drain electrode 20 so as to sandwich the drain electrode 20. Two source electrodes 19 are provided on the side opposite to the drain electrode 20 so as to sandwich the gate electrodes 18, respectively. A common gate connection 61 is connected to the ends of the gate electrodes 18. A common source connection 62 is connected to the ends of the source electrodes 19. A trench 57 is provided around the outer periphery of this HFET so as to surround these electrodes. This example makes it possible to prevent leak current and decreased breakdown voltage due to dicing.

The embodiment of the invention has been described with reference to the examples. However, the invention is not limited to these examples, but is applicable to any other modifications readily devised by those skilled in the art.

Figure 18:
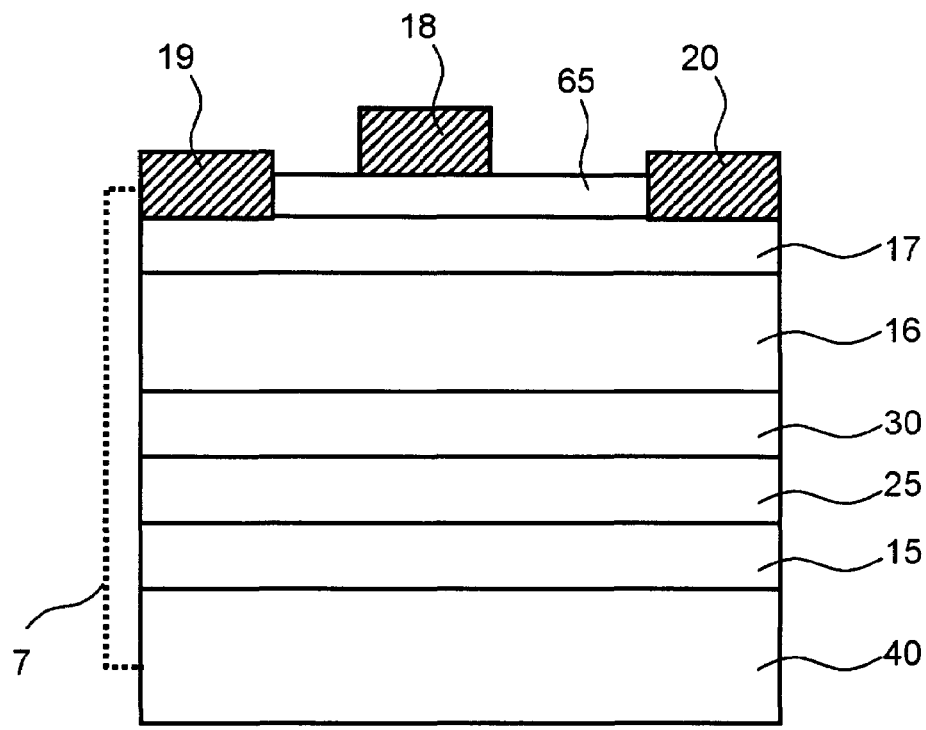
FIG. 18 is a schematic cross-sectional view showing a lateral HFET where a GaN cap layer 65 is provided between the AlGaN layer 17 and the gate electrode 18.
Figure 19:
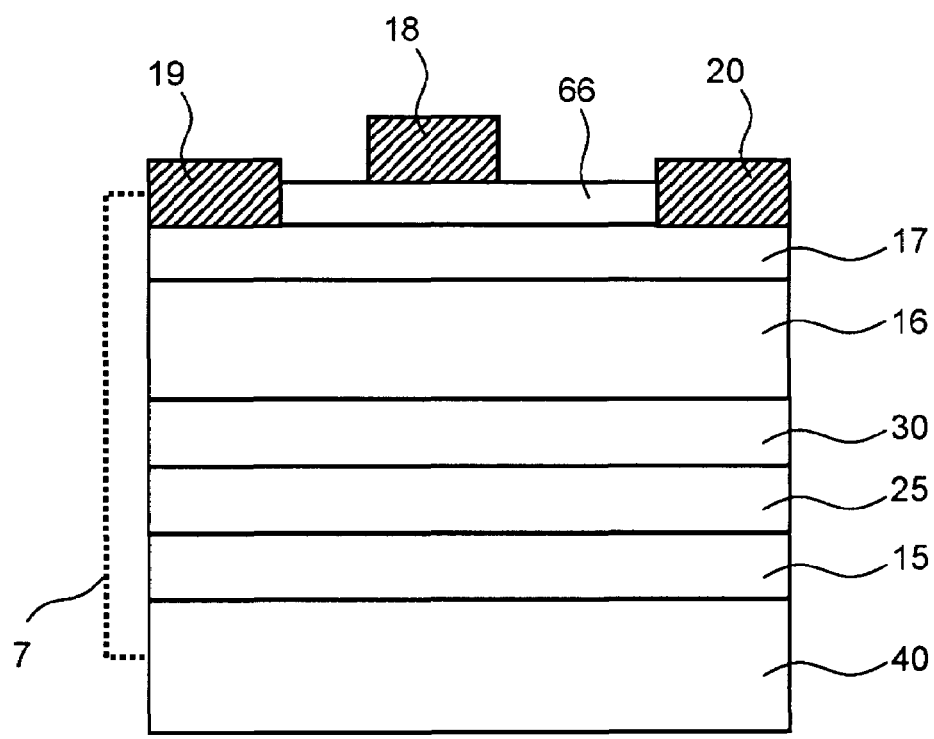
FIG. 19 is a schematic cross-sectional view showing a lateral HFET where a gate insulating film 66 is provided between the AlGaN layer 17 and the gate electrode 18.
Figure 20:
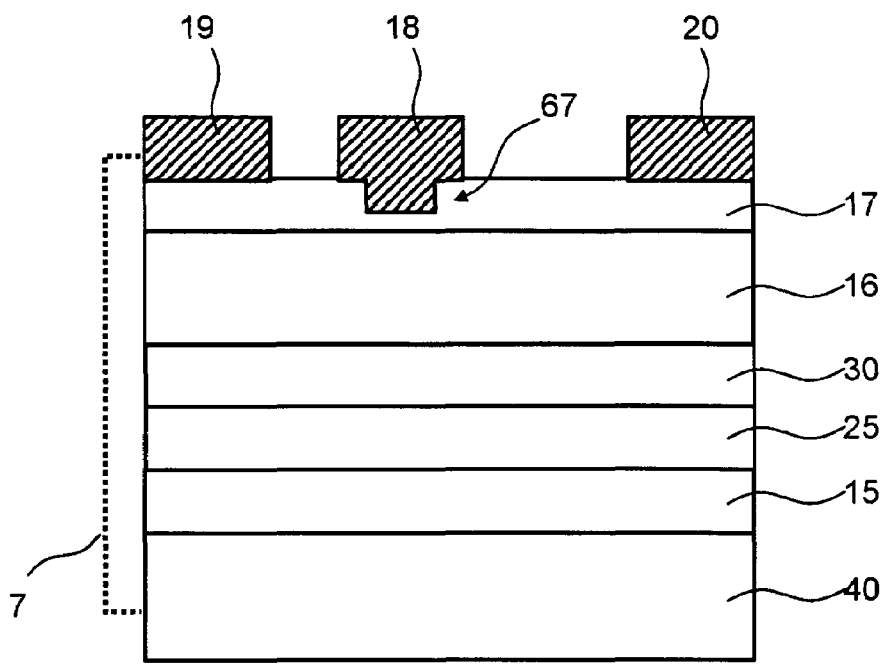
FIG. 20 is a schematic cross-sectional view showing a lateral HFET where a gate electrode 18 is formed in a recess 67 provided in the AlGaN layer 17.
Figure 21:
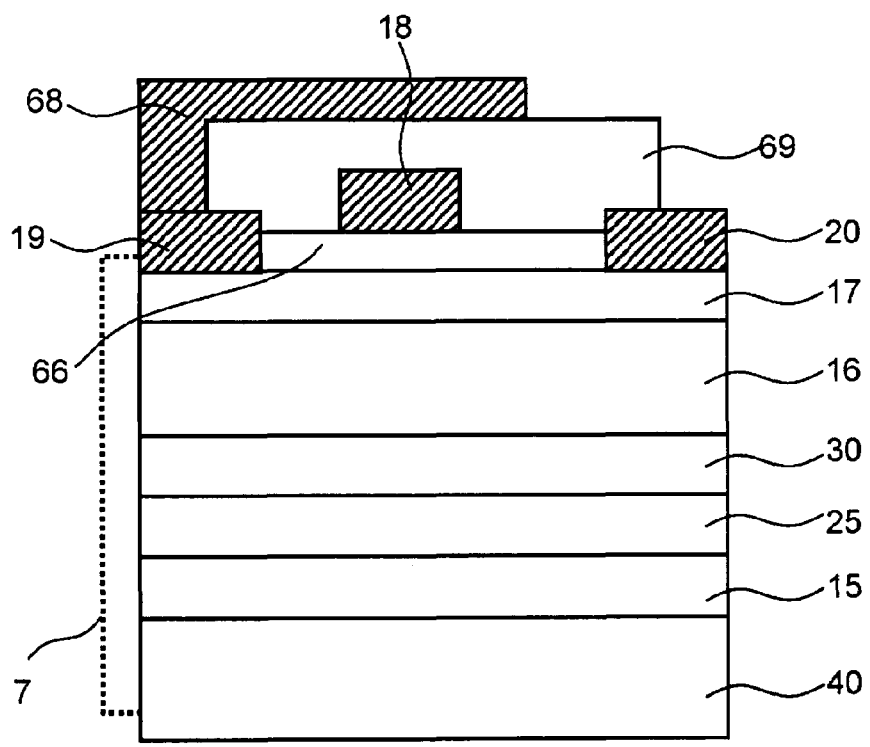
FIG. 21 is a schematic cross-sectional view showing a lateral HFET with a field plate electrode 68.

The HFET of this embodiment has been described with reference to AlGaN/GaN heterostructures. However, even if the upper portion of the device structure is different, the same effect as that of the nitride semiconductor device 5 of this embodiment is achieved as long as a high voltage is vertically applied to the device. For example, as shown in FIG. 18, the device may have a lateral HFET structure where a GaN cap layer 65 is provided between the AlGaN layer 17 and the gate electrode 18. As shown in FIG. 19, the device may have a MIS (Metal-Insulator-Semiconductor) gate structure where a gate insulating film 66 is provided between the AlGaN layer 17 and the gate electrode 18. As shown in FIG. 20, the gate electrode 18 may be formed in a recess 67 provided in the AlGaN layer 17. As shown in FIG. 21, a field plate electrode 68 may be provided on an insulating film 69 covering the gate electrode 18.

The combination of the barrier layer and the channel layer is not limited to the combination of AlGaN/GaN. The same effect is achieved also with the combination of GaN/InGaN or AlN/AlGaN.

The material of the barrier layer is not limited to undoped AlGaN. The same effect is achieved also with n-type AlGaN.

The structure between the gate electrode 18 and the drain electrode 20 of the HFET is the same as the lateral heterostructure Schottky barrier diode (HSBD). Hence the structure of this invention can be used to produce an HSBD having high breakdown voltage.

The elements of each example described above can be combined with each other as long as feasible. Such combinations are also encompassed within the scope of the invention as long as they include the features of the invention. The "nitride semiconductor" used herein includes semiconductors having any composition represented by the chemical formula $B_xAl_yGa_zIn_{1-x-y-z}N$ ($0 \leq x \leq 1$, $0 \leq y \leq 1$, $0 \leq z \leq 1$, $x+y+z \leq 1$) where the composition ratios x, y, and z are varied in the respective ranges. Furthermore, the "nitride semiconductor" also includes those further containing any of various dopants added for controlling conductivity types.

The invention claimed is:

1. A nitride semiconductor device comprising:
   a conductive substrate;
   a first semiconductor layer made of $Al_XGa_{1-X}N$ ($0 \leq X \leq 1$) of a first conductivity type provided on the substrate;
   a second semiconductor layer made of a first nitride semiconductor provided on the first semiconductor layer;
   a third semiconductor layer made of a second nitride semiconductor provided on the second semiconductor layer, the second nitride semiconductor being undoped or of n-type and having a wider bandgap than the first nitride semiconductor;
   a first main electrode connected to the third semiconductor layer and the substrate;
   a second main electrode connected to the third semiconductor layer; and
   a control electrode provided on the third semiconductor layer.

2. The nitride semiconductor device according to claim 1, wherein the substrate is made of SiC or Si.

3. The nitride semiconductor device according to claim 1, further comprising:
   a fourth semiconductor layer made of undoped $Al_UGa_{1-U}N$ ($0 \leq U \leq$, $X<U$) provided between the first semiconductor layer and the second semiconductor layer.

4. The nitride semiconductor device according to claim 1, wherein the substrate has conductivity of the first conductivity type.

5. The nitride semiconductor device according to claim 1, wherein the substrate has a laminated structure in which a lowly doped Si layer is formed on a highly doped p-type Si substrate.

6. The nitride semiconductor device according to claim 5, wherein a carrier concentration of the lowly doped Si layer is not greater than $1\times10^{16}$ cm$^{-3}$.

7. The nitride semiconductor device according to claim 5, wherein outer periphery of a device region is surrounded by a trench which reach the substrate.

8. The nitride semiconductor device according to claim 7, wherein the trench is filled with an insulator.

9. The nitride semiconductor device according to claim 1, wherein the first conductivity type is an n-type.

10. The nitride semiconductor device according to claim 1, wherein a minimum distance between the first main electrode and the control electrode is smaller than a minimum distance between the second main electrode and the control electrode.

11. The nitride semiconductor device according to claim 1, wherein a carrier concentration of the first semiconductor layer is not smaller than $1 \times 10^{13}$ cm$^{-2}$ in terms of sheet concentration.

12. A nitride semiconductor device comprising:
a conductive substrate;
a first buffer layer made of an undoped $Al_XGa_{1-X}N$ ($0 \leq X \leq 1$) provided on the substrate;
a second buffer layer made of an n-type $Al_YGa_{1-Y}N$ ($0 \leq Y \leq 1$) provided on the first buffer layer;
a first semiconductor layer made of a first nitride semiconductor provided on the second buffer layer;
a second semiconductor layer made of a second nitride semiconductor provided on the first semiconductor layer, the second nitride semiconductor being undoped or of n-type and having a wider bandgap than the first nitride semiconductor;
a first main electrode connected to the second semiconductor layer and the substrate;
a second main electrode connected to the second semiconductor layer; and
a control electrode provided on the second semiconductor layer.

13. The nitride semiconductor device according to claim 12, wherein the first buffer layer is made of AlN, and the second buffer layer is made of GaN.

14. The nitride semiconductor device according to claim 12, wherein the substrate is made of SiC or Si.

15. The nitride semiconductor device according to claim 12, further comprising:
a fourth semiconductor layer made of undoped $Al_UGa_{1-U}N$ ($0 \leq U \leq 1$, $X<U$) provided between the second buffer layer and the first semiconductor layer.

16. The nitride semiconductor device according to claim 12, wherein a carrier concentration of the buffer layer is not smaller than $1 \times 10^{13}$ cm$^{-2}$ in terms of sheet concentration.

17. A nitride semiconductor device comprising:
a conductive substrate having a laminated structure in which a lowly doped Si layer is formed on a highly doped p-type Si substrate;
a buffer layer made of $Al_XGa_{1-X}N$ ($0 \leq X \leq 1$) of a first conductivity type provided on the conductive substrate;
a first semiconductor layer made of a first nitride semiconductor provided on the buffer layer;
a second semiconductor layer made of a second nitride semiconductor provided on the first semiconductor layer, the second nitride semiconductor being undoped or of n-type and having a wider bandgap than the first nitride semiconductor;
a first main electrode connected to the second semiconductor layer and the conductive substrate;
a second main electrode connected to the second semiconductor layer;
a control electrode provided on the second semiconductor layer; and
an insulator covering a side face of the buffer layer.

18. The nitride semiconductor device according to claim 17, further comprising:
a fourth semiconductor layer made of undoped $Al_UGa_{1-U}N$ ($0 \leq U \leq 1$, $X<U$) provided between the buffer layer and the first semiconductor layer.

19. The nitride semiconductor device according to claim 17, wherein outer periphery of a device region is surrounded by a trench, and the trench is filled with the insulator.

* * * * *